United States Patent
Yang et al.

(10) Patent No.: US 8,929,009 B2
(45) Date of Patent: Jan. 6, 2015

(54) IRREGULAR LOW DENSITY PARITY CHECK DECODER WITH LOW SYNDROME ERROR HANDLING

(71) Applicant: LSI Corporation, San Jose, CA (US)

(72) Inventors: Shaohua Yang, San Jose, CA (US); Anatoli A. Bolotov, San Jose, CA (US); Chung-Li Wang, San Jose, CA (US); Zongwang Li, San Jose, CA (US); Shu Li, Milpitas, CA (US); Mikhail I Grinchuk, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/777,381

(22) Filed: Feb. 26, 2013

(65) Prior Publication Data

US 2014/0168811 A1     Jun. 19, 2014

Related U.S. Application Data

(60) Provisional application No. 61/739,372, filed on Dec. 19, 2012.

(51) Int. Cl.
| | | |
|---|---|---|
| *G11B 5/09* | (2006.01) | |
| *H03M 13/00* | (2006.01) | |
| *G11B 20/18* | (2006.01) | |
| *H03M 13/11* | (2006.01) | |
| *H03M 13/27* | (2006.01) | |
| *H03M 13/09* | (2006.01) | |

(52) U.S. Cl.
CPC ........... *G11B 20/18* (2013.01); *H03M 13/1111* (2013.01); *H03M 13/1128* (2013.01); *H03M 13/27* (2013.01); *H03M 13/6331* (2013.01); *G11B 20/1833* (2013.01); *H03M 13/09* (2013.01); *G11B 2020/185* (2013.01)
USPC .............................. 360/39; 360/53; 714/758

(58) Field of Classification Search
None
See application file for complete search history.

(56) References Cited

U.S. PATENT DOCUMENTS

| | | | |
|---|---|---|---|
| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |
| 5,417,500 | A | 5/1995 | Martinie |
| 5,513,192 | A | 4/1996 | Janku |
| 5,523,903 | A | 6/1996 | Hetzler |
| 5,550,810 | A | 8/1996 | Monogioudis et al. |
| 5,550,870 | A | 8/1996 | Blaker |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Regina N Holder
(74) *Attorney, Agent, or Firm* — Hamilton DeSanctis & Cha (57) ABSTRACT

A data processing system is disclosed including a data decoder circuit, an error handling circuit and a syndrome checker circuit. The data decoder circuit is operable to apply a data decode algorithm to a decoder input to yield a decoded output, and to calculate a syndrome indicating an error level for the decoded output. The error handling circuit is operable to determine whether any errors in the decoded output involve user data bits. The syndrome checker circuit is operable to trigger the error handling circuit based at least in part on the syndrome.

24 Claims, 6 Drawing Sheets

(56) References Cited

U.S. PATENT DOCUMENTS

| | | |
|---|---|---|
| 5,612,964 A | 3/1997 | Haraszti |
| 5,701,314 A | 12/1997 | Armstrong |
| 5,710,784 A | 1/1998 | Kindred |
| 5,712,861 A | 1/1998 | Inoue |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,438,717 B1 | 8/2002 | Butler |
| 6,473,878 B1 | 10/2002 | Wei |
| 6,535,553 B1 | 3/2003 | Limberg et al. |
| 6,625,775 B1 | 9/2003 | Kim |
| 6,657,803 B1 | 12/2003 | Ling et al. |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson et al. |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir et al. |
| 7,133,228 B2 | 11/2006 | Fung et al. |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz et al. |
| 7,308,061 B1 | 12/2007 | Huang |
| 7,310,768 B2 | 12/2007 | Eidson et al. |
| 7,313,750 B1 | 12/2007 | Feng |
| 7,370,258 B2 | 5/2008 | Iancu et al. |
| 7,415,651 B2 | 8/2008 | Argon |
| 7,502,189 B2 | 3/2009 | Sawaguchi et al. |
| 7,523,375 B2 | 4/2009 | Spencer |
| 7,587,657 B2 | 9/2009 | Haratsch |
| 7,590,168 B2 | 9/2009 | Raghavan et al. |
| 7,646,829 B2 | 1/2010 | Ashley et al. |
| 7,730,384 B2 | 1/2010 | Graef et al. |
| 7,702,986 B2 | 4/2010 | Bjerke et al. |
| 7,702,989 B2 | 4/2010 | Graef et al. |
| 7,738,201 B2 | 6/2010 | Jin et al. |
| 7,752,523 B1 | 7/2010 | Chaichanavong et al. |
| 7,779,325 B2 | 8/2010 | Song |
| 7,802,172 B2 | 9/2010 | Vila Casado et al. |
| 7,952,824 B2 | 5/2011 | Dziak et al. |
| 7,958,425 B2 | 6/2011 | Chugg et al. |
| 7,971,125 B2 | 6/2011 | Graef et al. |
| 7,990,642 B2 | 8/2011 | Lee et al. |
| 7,996,746 B2 | 8/2011 | Livshitz et al. |
| 8,018,360 B2 | 9/2011 | Nayak |
| 8,176,404 B2 | 5/2012 | Yang et al. |
| 8,201,051 B2 | 6/2012 | Tan et al. |
| 8,237,597 B2 | 8/2012 | Liu et al. |
| 8,261,171 B2 | 9/2012 | Annampedu |
| 8,291,284 B2 | 10/2012 | Savin |
| 8,295,001 B2 | 10/2012 | Liu et al. |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0080211 A1 | 4/2011 | Yang |
| 2011/0087933 A1* | 4/2011 | Varnica et al. ............. 714/704 |
| 2011/0161633 A1 | 6/2011 | Xu |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0200954 A1 | 8/2012 | Jin |
| 2012/0207201 A1 | 8/2012 | Xia |
| 2012/0212849 A1 | 8/2012 | Xu |
| 2012/0236429 A1 | 9/2012 | Yang |
| 2012/0262814 A1 | 10/2012 | Li |
| 2012/0265488 A1 | 10/2012 | Sun |
| 2013/0061112 A1* | 3/2013 | Chen et al. .................. 714/758 |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low—density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

(56) References Cited

OTHER PUBLICATIONS

Olmos et al., "Tree-Structure Expectation Propagation for LDPC Decoding in Erasure Channels", Cornell University Library arXiv:1009.4287 (Sep. 22, 2010).
Shokrollahi "LDPC Codes: An Introduction", Digital Fountain, Inc. (Apr. 2, 2003).
Spagnol et al, "Hardware Implementation of GF(2Am) LDPC Decoders", IEEE Transactions on Circuits and Systemssi: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/305,510, Unpublished (filed Nov. 28, 2011) (Lei Chen).
U.S. Appl. No. 13/611,158, Unpublished (filed Sep. 12, 2012) (Yang Han).
U.S. Appl. No. 13/113,219, Unpublished (filed May 23, 2011) (Yang Han).
U.S. Appl. No. 13/369,468, Unpublished (filed Feb. 9, 2012) (Zongwang Li).
U.S. Appl. No. 13/227,544, Unpublished (filed Sep. 8, 2011) (Shaohua Yang).
U.S. Appl. No. 13/305,551, Unpublished (filed Nov. 28, 2011) (Yang Han).
U.S. Appl. No. 13/269,852, Unpublished (filed Oct. 10, 2011) (Haitao Xia).
U.S. Appl. No. 13/284,730, Unpublished (filed Oct. 28, 2011) (Fan Zhang).
U.S. Appl. No. 13/284,767, Unpublished (filed Oct. 28, 2011) (Fan Zhang).
U.S. Appl. No. 13/269,832, Unpublished (filed Oct. 10, 2011) (Haitao Xia).
U.S. Appl. No. 13/300,078, Unpublished (filed Nov. 18, 2011) (Chung-Li Wang).
U.S. Appl. No. 13/239,683, Unpublished (filed Sep. 22, 2011) (Changyou Xu).
U.S. Appl. No. 13/186,234, Unpublished (filed Jul. 19, 2011) (Haitao Xia).
U.S. Appl. No. 13/213,751, Unpublished (filed Aug. 19, 2011) (Fan Zhang).
U.S. Appl. No. 13/283,549, Unpublished (filed Oct. 27, 2011) (Wu Chang).
U.S. Appl. No. 13/227,416, Unpublished (filed Sep. 7, 2011) (Lei Chen).
U.S. Appl. No. 13/296,022, Unpublished (filed Nov. 14, 2011) (Victor Krachkovsky).
U.S. Appl. No. 13/174,537, Unpublished (filed Jun. 30, 2011) (Anantha Raman Krishnan).
U.S. Appl. No. 13/180,495, Unpublished (filed Jul. 11, 2011) (Chung-Li Wang).
U.S. Appl. No. 13/171,615, Unpublished (filed Jun. 29, 2011) (Bradley D. Seago).
U.S. Appl. No. 13/340,951, Unpublished (filed Dec. 30, 2011) (Lei Chen).
U.S. Appl. No. 13/295,150, Unpublished (filed Nov. 14, 2011) (Zongwang Li).
U.S. Appl. No. 13/174,453, Unpublished (filed Jun. 30, 2011) (Johnson Yen).
U.S. Appl. No. 13/619,907, Unpublished (filed Sep. 14, 2012) (Fan Zhang).
U.S. Appl. No. 13/363,751, Unpublished (filed Feb. 1, 2012) (Lei Chen).
U.S. Appl. No. 13/602,440, Unpublished (filed Sep. 4, 2012) (Fan Zhang).
U.S. Appl. No. 13/340,974, Unpublished (filed Dec. 30, 2011) (Dan Liu).
U.S. Appl. No. 13/644,589, Unpublished (filed Oct. 4, 2012) (Shaohua Yang).
U.S. Appl. No. 13/302,119, Unpublished (filed Nov. 22, 2011) (Lei Chen).
U.S. Appl. No. 13/624,927, Unpublished (filed Sep. 22, 2012) (Shaohua Yang).
U.S. Appl. No. 13/545,833, Unpublished (filed Jul. 10, 2012) (Zhi Bin Li).
U.S. Appl. No. 13/596,819, Unpublished (filed Aug. 28, 2012) (Shaohua Yang).
U.S. Appl. No. 13/596,947, Unpublished (filed Aug. 28, 2012) (Fan Zhang).
U.S. Appl. No. 13/560,737, Unpublished (filed Jul. 27, 2012) (Weijun Tan).
U.S. Appl. No. 13/597,001, Unpublished (filed Aug. 28, 2012) (Fan Zhang).
U.S. Appl. No. 13/644,542, Unpublished (filed Oct. 4, 2012) (Shaohua Yang).
U.S. Appl. No. 13/621,341, Unpublished (filed Sep. 17, 2012) (Shaohua Yang).
U.S. Appl. No. 13/597,026, Unpublished (filed Aug. 28, 2012) (Fan Zhang).
U.S. Appl. No. 13/989,583, Unpublished (filed Oct. 15, 2012) (Shaohua Yang).
U.S. Appl. No. 13/622,294, Unpublished (filed Sep. 18, 2012) (Fan Zhang).
U.S. Appl. No. 13/670,393, Unpublished (filed Nov. 6, 2012) (Lei Chen).
U.S. Appl. No. 13/645,838, Unpublished (filed Oct. 5, 2012) (Chung-Li Wang).
U.S. Appl. No. 13/741,003, Unpublished (filed Jan. 14, 2013) (Lu Lu).
U.S. Appl. No. 13/742,336, Unpublished (filed Jan. 15, 2013) (Jianzhong Huang).
U.S. Appl. No. 13/742,340, Unpublished (filed Jan. 15, 2013) (Razmik Karabed).
U.S. Appl. No. 13/708,941, Unpublished (filed Dec. 8, 2012) (Anatoli A. Bolotov).
U.S. Appl. No. 13/596,978, Unpublished (filed Aug. 28, 2012) (Fan Zhang).
U.S. Appl. No. 13/362,409, Unpublished (filed Jan. 31, 2012) (Fan Zhang).
U.S. Appl. No. 13/465,214, Unpublished (filed May 7, 2012) (Chung-Li Wang).
U.S. Appl. No. 13/445,858, Unpublished (filed Apr. 12, 2012) (Johnson Yen).
U.S. Appl. No. 13/459,282, Unpublished (filed Apr. 30, 2012) (Fan Zhang).
U.S. Appl. No. 13/412,492, Unpublished (filed Mar. 5, 2012) (Shaohua Yang).
U.S. Appl. No. 13/445,834, Unpublished (filed Apr. 12, 2012) (Chung-Li Wang).
U.S. Appl. No. 13/422,986, Unpublished (filed Mar. 16, 2012) (Fan Zhang).
U.S. Appl. No. 13/474,660, Unpublished (filed May 17, 2012) (Zongwang Li).
U.S. Appl. No. 13/372,580, Unpublished (filed Feb. 14, 2012) (Fan Zhang).
U.S. Appl. No. 13/426,714, Unpublished (filed Mar. 22, 2012) (Shaohua Yang).
U.S. Appl. No. 13/433,693, Unpublished (filed Mar. 29, 2012) (Fan Zhang).
U.S. Appl. No. 13/445,848, Unpublished (filed Apr. 12, 2012) (Bruce Wilson).
U.S. Appl. No. 13/326,367, Unpublished (filed Dec. 15, 2011) (Shaohua Yang).
U.S. Appl. No. 13/316,858, Unpublished (filed Dec. 12, 2011) (Zongwang Li).
U.S. Appl. No. 13/316,741, Unpublished (filed Dec. 12, 2011) (Yang Han).
U.S. Appl. No. 13/326,363, Unpublished (filed Dec. 15, 2011) (Fan Zhang).

(56) References Cited

OTHER PUBLICATIONS

U.S. Appl. No. 13/372,600, Unpublished (filed Feb. 14, 2012) (Shaohua Yang).
U.S. Appl. No. 13/483,982, Unpublished (filed May 30, 2012) (Yang Han).
U.S. Appl. No. 13/474,672, Unpublished (filed May 17, 2012) (Fan Zhang).
U.S. Appl. No. 13/327,279, Unpublished (filed Dec. 15, 2011) (Wei Feng).
U.S. Appl. No. 13/490,849, Unpublished (filed Jun. 7, 2012) (Johnson Yen).
U.S. Appl. No. 13/445,878, Unpublished (filed Apr. 12, 2012) (Yu Liao).
U.S. Appl. No. 13/412,520, Unpublished (filed Mar. 5, 2012) (Fan Zhang).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 08/99.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

IRREGULAR LOW DENSITY PARITY CHECK DECODER WITH LOW SYNDROME ERROR HANDLING

CROSS REFERENCE TO RELATED APPLICATIONS

The present application claims priority to (is a non-provisional of) U.S. Pat. App. No. 61/739,372, entitled "Irregular Low Density Parity Check Decoder With Low Syndrome Error Handling", and filed Dec. 19, 2012 by Yang et al, the entirety of which is incorporated herein by reference for all purposes.

FIELD OF THE INVENTION

Various embodiments of the present inventions provide apparatuses and methods for handling low syndrome errors during irregular low density parity check decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error correction systems have been developed to detect and correct errors in digital data, encoding the data in the sender and decoding in the receiver to recover the originally written data.

SUMMARY

A data processing system is disclosed including a data decoder circuit, an error handling circuit and a syndrome checker circuit. The data decoder circuit is operable to apply a data decode algorithm to a decoder input to yield a decoded output, and to calculate a syndrome indicating an error level for the decoded output. The error handling circuit is operable to determine whether any errors in the decoded output involve user data bits. The syndrome checker circuit is operable to trigger the error handling circuit based at least in part on the syndrome.

This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Low syndrome error handling is provided in a low density parity check decoder for irregular low density parity check codes. When the decoding results in a syndrome with a Hamming weight or value that is low enough that the errors may be limited to parity bits, the low syndrome error handling enables the low density parity check decoder to either correct the errors in the parity bits to complete decoding or to determine whether the user data is correct despite the non-zero syndrome and thus to complete decoding.

The low density parity check decoder with low syndrome error handling may be, but is not limited to, a binary or non-binary decoder, with layer or non-layer decoding for regular or irregular low density parity check codes. Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as dynamic random-access memory, negated-AND flash, negated-OR flash, other non-volatile memories and solid state drives.

Figure 1:
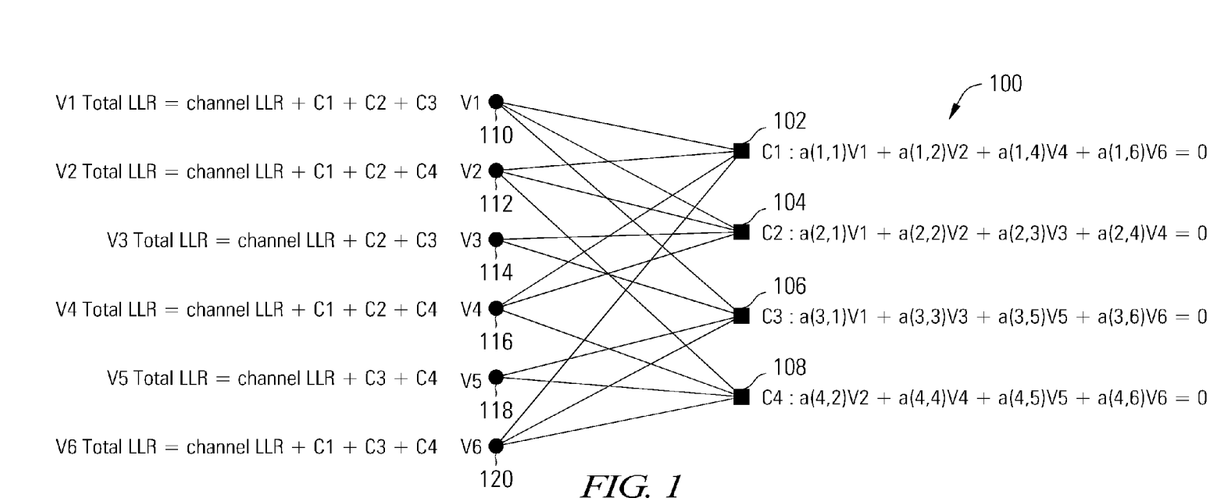
FIG. 1 depicts a Tanner graph of an irregular low density parity check code that may be decoded in a low density parity check code decoder with low syndrome error handling in accordance with some embodiments of the present invention.

A low density parity check code is a parity-based code that can be visually represented in a Tanner graph 100 as illustrated in FIG. 1. In a low density parity check decoder, multiple parity checks are performed in a number of check nodes 102, 104, 106 and 108 for a group of variable nodes 110, 112, 114, 116, 118, 120. The connections (or edges) between variable nodes 110-120 and check nodes 102-108 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 110-120 and check nodes 102-108 in an iterative decoding process, passing beliefs about the values that should appear in variable nodes 110-120 to connected check nodes 102-108. Parity checks are performed in the check nodes 102-108 based on the messages and the results are returned to connected variable nodes 110-120 to update the beliefs if necessary. In a non-binary low density parity check decoder, variable nodes 110-120 contain symbols from a Galois Field, a finite field $GF(p^k)$ that contains a finite number of elements, characterized by size $p^k$ where p is a prime number and k is a positive integer. The beliefs about the values that should appear in variable nodes 110-120 are represented as soft information, containing a likelihood or probability for each possible value of a variable node that the corresponding possible value is the correct value for the variable node. In some embodiments of a GF(4) decoder, the soft information for a given variable node includes four probability values, one for each of the four possible values of the variable node, with each probability value giving the likelihood that the corresponding possible value is the correct value of the variable node, and with the sum of the four probability values being 1. Messages in the non-binary low density parity check decoder are multi-dimensional soft information vectors, generally either plain-likelihood probability vectors or log likelihood ratio vectors. The term symbol is used hereinafter to refer to both multi-bit and single-bit data values.

The connections between variable nodes 110-120 and check nodes 102-108 may be presented in matrix form as follows, where columns represent variable nodes and rows represent check nodes. A random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & a(1,2) & 0 & a(1,4) & 0 & a(1,6) \\ a(2,1) & a(2,2) & a(2,3) & a(2.4) & 0 & 0 \\ a(3,1) & 0 & a(3,3) & 0 & a(3,5) & a(3,6) \\ 0 & a(4,2) & 0 & a(4,4) & a(4,5) & a(4,6) \end{bmatrix}$$

The H matrix above is the parity check matrix for a simple irregular low density parity check code, including both weight-2 and weight 3 columns. Notably, the low density parity check decoder with low syndrome error handling is not limited to any particular column weights. In the H matrix above, columns 1, 2, 4 and 6 are weight-3 columns, meaning that the variable nodes corresponding to columns 1, 2, 4 and 6 are each connected to three check nodes. Columns 3 and 5 are weight-2 columns, meaning that the variable nodes corresponding to columns 3 and 5 are each connected to two check nodes. Each non-zero value in the H matrix is a non-zero value on GF(q), which may have a value from 0 to q−1.

By providing multiple check nodes 102-108 for the group of variable nodes 110-120, redundancy in error checking is provided, enabling errors to be corrected as well as detected. Each check node 102-108 performs a parity check on bits or symbols passed as messages from its neighboring (or connected) variable nodes. In the example low density parity check code corresponding to the Tanner graph 100 of FIG. 1, check node 102 checks the parity of variable nodes 110, 112, 116, and 120. Values are passed back and forth between connected variable nodes 110-120 and check nodes 102-108 in an iterative process until the low density parity check code converges on a value for the group of data and parity bits in the variable nodes 110-120. For example, the total log likelihood ratio value of variable node 110 is calculated based on the channel log likelihood ratio value and messages from check nodes 102, 104 and 106. Variable node 110 passes messages to check nodes 102, 104 and 106. Check node 102 passes messages back to variable nodes 110, 112, 116 and 120. The messages between variable nodes 110-120 and check nodes 102-108 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-108, with the values in the nodes 102-120 being adjusted based on the messages that are passed, until the values converge and stop changing or until processing is halted.

Figure 2:
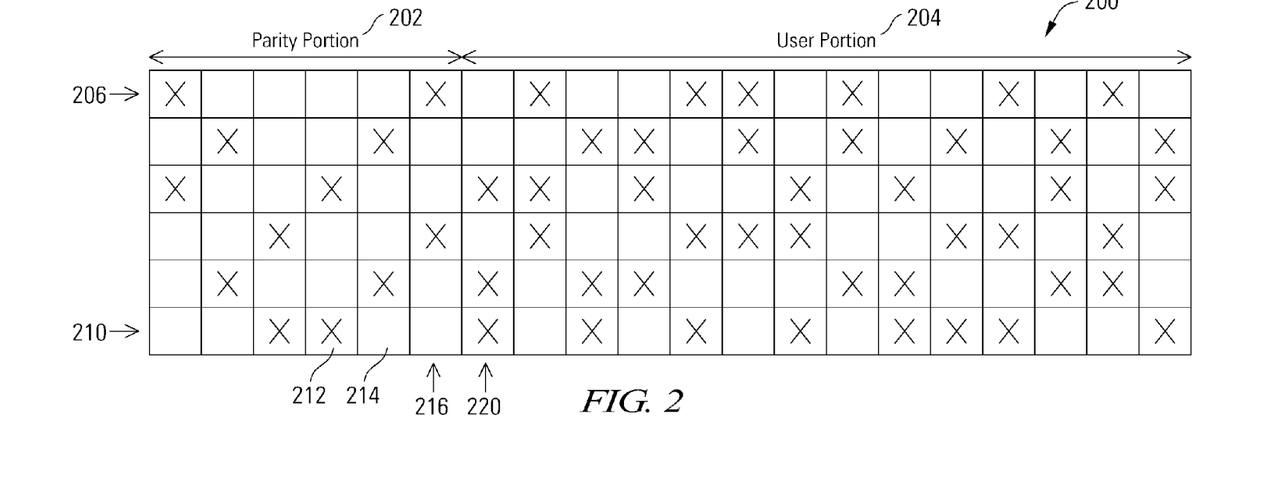
FIG. 2 depicts an irregular parity check H matrix for a low density parity check decoder with low syndrome error handling in accordance with one or more embodiments of the present invention.

In general, high column-weight bits are better protected than low column-weight bits. User data bits are more important than parity bits from the user's point of view, thus in some embodiments, user data is allocated to high column-weight locations. Turning to FIG. 2, a parity check H matrix 200 for an irregular low density parity check decoder with low syndrome error handling is depicted in accordance with one or more embodiments of the present invention. In this embodiment, parity bits are allocated to a parity portion 202 of the H matrix 200, with a column weight of 2, and user data bits are allocated to a user portion 204 of the H matrix 200, with a column weight of 3. Notably, the low density parity check decoder with low syndrome error handling is not limited to any particular H matrix, H matrix layout, or column weights.

The H matrix 200 shows the connections between variable nodes (e.g., 216, 220), represented by columns, and check nodes (e.g., 206, 210), represented by rows. Each bit or symbol in the data set being decoded is assigned to a variable node. Parity bits or symbols in the data set are shown in the parity portion 202 of the H matrix 200, and user data bits or symbols are shown in the user portion 204 of the H matrix 200, although the parity bits or symbols and the user data bits or symbols may be distributed in any suitable manner though the H matrix 200. Variable node values are updated based on inputs from check nodes connected to each variable node. Parity checks are performed in check nodes based on values passed from variable nodes connected to each check node. An "X" in a cell (e.g., 212) of the H matrix 200 represents a non-zero value in the cell, indicating that the variable node associated with the cell's column is connected to the check node associated with the cell's row, and an empty cell (e.g., 214) represents a zero value in the cell, indicating that the variable node associated with the cell's column is not connected to the check node associated with the cell's row. Although low syndrome error handling is applicable to both regular and irregular low density parity check decoders, the H matrix 200 of FIG. 2 is an irregular low density parity check code, including both weight-2 columns (e.g., 216) and weight-3 columns (e.g., 220), meaning that the variable node of column 216 is connected to two check nodes and the variable node of column 220 is connected to three check nodes. The data set is decoded iteratively in the low density parity check with dynamic scaling, in some embodiments progressing layer by layer through the H matrix 200, beginning with the first layer 206 and ending the local decoding iteration with the last layer 210.

In some embodiments, user bits from a low density parity check encoder are processed by a modulation encoder that imposes pattern constraints, for example limiting runs of transitions, while parity bits are not processed by the modulation encoder. In these embodiments, the user bits have a better signal to noise ratio than the parity bits. Errors are thus more likely to occur in the parity bits than in the user bits. By allocating the parity bits, with their higher error rate, to columns in the H matrix 200 with lower column weights, parity bit errors affect fewer parity syndromes. Due to the low column-weight parity check on the parity bits, the parity bits are often slower to correct than user data errors. This phenomenon is more pronounced at certain signal and noise conditions, and with some decoding algorithms when log likelihood ratio amplitudes grow too fast over decoding iterations and saturate too early. In many data sets or sectors that fail during decoding, it can be observed that only one or two bits are in error, resulting in a low syndrome error. Performing additional decoding iterations may not be helpful for these errors with saturated log likelihood ratio values, because the decoder becomes stuck on the saturated erroneous values.

Data convergence can be detected in a low density parity check decoder when the syndrome is 0, that is, when the vector obtained by multiplying the hard decision outcome of the low density parity check decoder by the H matrix equals 0. Given an H matrix divided into a parity portion Hp and a user portion Hu as in FIG. 2, and if u represents the user data and p represents the parity bits in the decoded output, the iterative low density parity check decoder converges when [Hu,Hp]*[u;p]=0. However, with low but non-zero syndrome errors, syndromes with low Hamming weights that can be accounted for purely by parity bit errors, the low density parity check decoder with low syndrome error handling can still determine whether the user data converged correctly and indicate that decoding has completed successfully.

When the syndromes no longer decrease in the low density parity check decoder with successive decoding iterations, and when the syndrome Hamming weight is small, the errors are most likely in the parity bits. A threshold for the syndrome is provided, and in some embodiments is user programmable, used to trigger low syndrome error handling. The threshold is placed at a level for which the detected number of errors, based on the syndrome value, can all be in the parity bits. When the syndrome is non-zero but below the threshold, the low syndrome error handling is triggered. In some embodiments, this test is performed only after syndromes no longer decrease with successive decoding iterations. In other embodiments, the test is performed after every local decoding iteration.

In some embodiments of the low syndrome error handling, to determine if the user data is correct despite the low syndrome, an attempt is made to locate the parity bits that can correct the syndrome errors based on the syndrome location and values and the location of the parity portion of the H matrix. If the erroneous parity bits can be located that, when corrected, make the syndrome zero, the decoded user data is correct and the decoding process can be concluded. Erroneous parity bits are identified using a parity error checker or low syndrome checker circuit. In some embodiments, the parity error checker performs low density parity check decoding based only on the parity portion of the H matrix, essentially forming a much smaller H matrix including only parity bits and decoding the parity H matrix to detect and correct parity bit errors. In other embodiments, the parity error checker re-encodes the user data to produce computed parity bits that can be compared with the decoded parity bits to identify discrepancies. If the syndrome value can be accounted for by the parity bit discrepancies identified by the parity error checker, the user data portion is correct and decoding can be concluded despite the non-zero syndrome. In some of these embodiments, the erroneous parity bits can also be corrected, although they may not be needed after decoding in some systems.

In some other embodiments of the low syndrome error handling, the decoded user data is tested in a cyclic redundancy check circuit, and if the cyclic redundancy check syndrome is 0 for the decoded user data, the decoding is determined to have been successful despite the low but non-zero syndrome from the low density parity check decoding. In these embodiments, the erroneous parity bits generally remain uncorrected if they are not needed downstream. If they are needed, other operations can be performed to correct the parity bit errors.

By performing the low syndrome error handling when low syndromes are detected, other recovery features such as targeted bit or symbol flipping which are much slower can be avoided in some instances.

Figure 3:
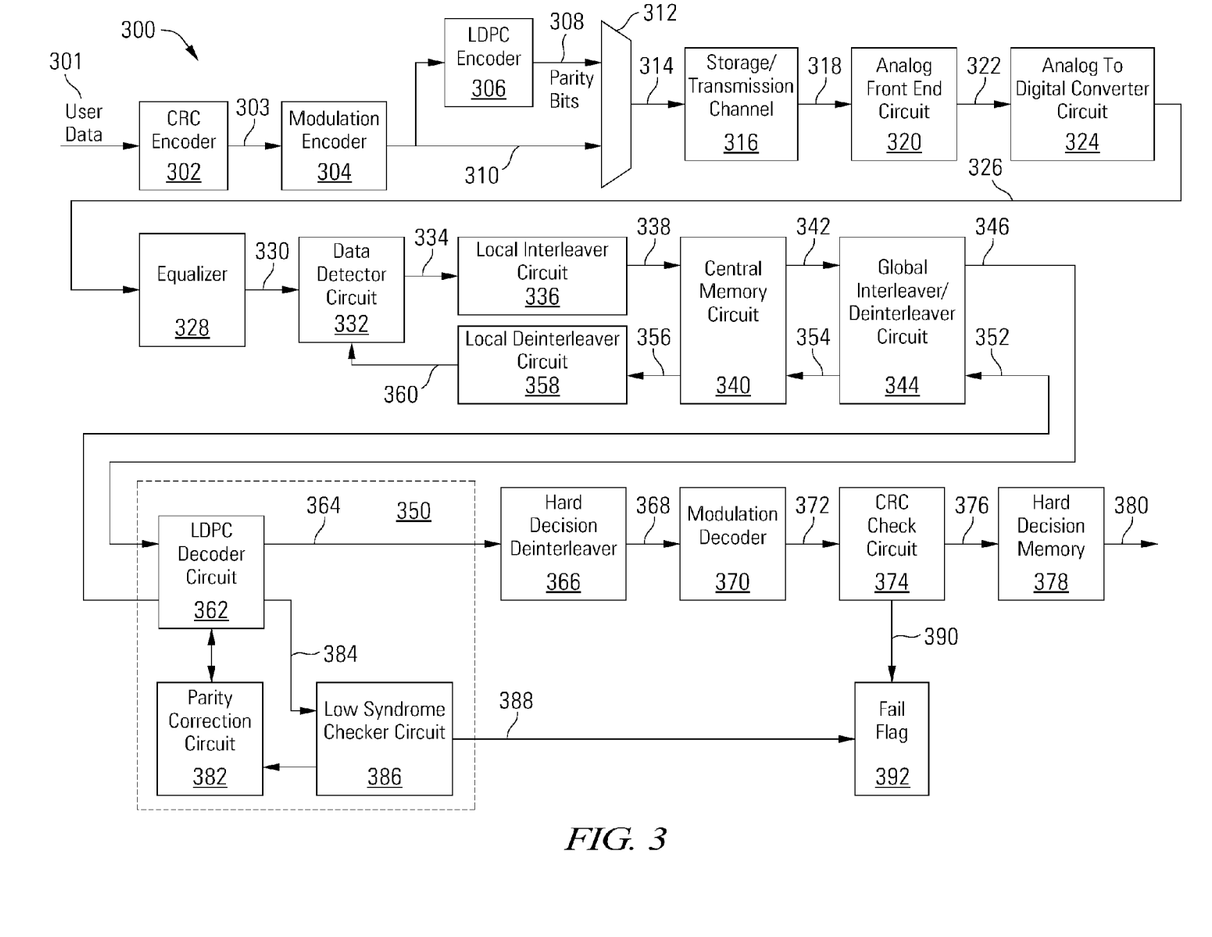
FIG. 3 depicts a block diagram of a data processing system with a data decoder circuit including a low density parity check decoder with low syndrome error handling which may be used to retrieve or receive stored or transmitted data in accordance with some embodiments of the present invention.

Turning to FIG. 3, a data processing system 300 is disclosed including a low density parity check decoder with low syndrome error handling which may be used to retrieve or receive stored or transmitted data in accordance with some embodiments of the present invention. The data processing system 300 is operable to process user data bits 301, store them in or transit them through a storage or transmission channel 316 and retrieve the decoded user data bits 374 without introducing errors.

The user data bits 301 are processed by a cyclic redundancy check encoder 302 which generates cyclic redundancy check bits for the user data bits 301 and inserts them into the user data bits 301. The cyclic redundancy check bits are calculated and added to the user data bits 301 in any suitable manner, yielding user data with channel cyclic redundancy check bits 303. Based upon the disclosure provided herein, one of ordinary skill in the art will recognize a variety of cyclic redundancy check encoders that may be used in relation to different embodiments of the present invention.

The user data with channel cyclic redundancy check bits 303 are processed in a modulation encoder 304 that imposes pattern constraints, yielding constrained data 310. In some embodiments, modulation encoder 304 is an enumerative encoder that supports the Maximum Transition Run constraint. The frequency response of the data processing system 300 is generally at a maximum at DC and degrades near the Nyquist frequency, particularly when the storage or transmission channel 316 is a magnetic storage device. By limiting the maximum transition run length in the constrained data 310, the data processing system 300 operates below the Nyquist frequency and avoids errors that might be introduced by the degraded frequency response near the Nyquist frequency. In some embodiments, the modulation encoder 304 also replaces long zero run patterns in the encoded user bits 303 that would cause degraded behavior of control loops at the decoder side. Based upon the disclosure provided herein, one of ordinary skill in the art will recognize a variety of modulation encoders that may be used in relation to different embodiments of the present invention.

The constrained data 310 is processed by a low density parity check encoder 306, which produces parity bits 308 for the constrained data 310. Again, because parity bits 308 are not covered by the modulation coding in modulation encoder 304, they have a relatively poor signal to noise ratio when compared with the constrained data 310. The parity bits 308 are combined with the constrained data 310 in a multiplexer 312, and the resulting encoded data 314 is stored in or transmitted through storage or transmission channel 316.

An analog signal 318 is retrieved from storage or transmission channel 316 and is processed in an analog front end circuit 320. Analog front end circuit 320 processes analog signal 318 and provides a processed analog signal 322 to an analog to digital converter circuit 324. Analog front end circuit 320 may include, but is not limited to, an analog filter and an amplifier circuit as are known in the art. Based upon the disclosure provided herein, one of ordinary skill in the art will recognize a variety of circuitry that may be included as part of analog front end circuit 320. In some embodiments, analog signal 318 is derived from a read/write head assembly (not shown) that is disposed in relation to a storage medium (e.g., 316). In other embodiments, analog signal 318 is derived from a receiver circuit (not shown) that is operable to receive a signal from a transmission medium (e.g., 316). The transmission medium may be wired or wireless. Based upon the disclosure provided herein, one of ordinary skill in the art will recognize a variety of source from which analog signal 318 may be derived.

Analog to digital converter circuit 324 converts the processed analog signal 322 into a corresponding series of digital samples. Analog to digital converter circuit 324 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. The digital samples are provided to an equalizer circuit 328. Equalizer circuit 328 applies an equalization algorithm to the digital samples to yield an equalized output 330. In some embodiments of the present invention, equalizer circuit 328 is a digital finite impulse response filter circuit as are known in the art. In some cases, equalizer circuit 328 includes sufficient memory to maintain one or more codewords until a data detector circuit 332 is available for processing, and for multiple processes through data detector circuit 332.

Data detector circuit 332 is operable to apply a data detection algorithm to a received codeword or data set, and in some cases data detector circuit 332 can process two or more codewords in parallel. In some embodiments of the present invention, data detector circuit 332 is a Viterbi algorithm data detector circuit as are known in the art. In other embodiments of the present invention, data detector circuit 332 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 332 is started based upon availability of a data set from equalizer circuit 328 or from a central memory circuit 340.

Upon completion, data detector circuit 332 provides a detector output which includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 334 is provided to a local interleaver circuit 336. Local interleaver circuit 336 is operable to shuffle sub-portions (i.e., local chunks) of the data set included as detected output 334 and provides an interleaved codeword 338 that is stored to central memory circuit 340. Local interleaver circuit 336 may be any circuit known in the art that is capable of shuffling data sets to yield a re-arranged data set.

Once a data decoding circuit 350 is available, a previously stored interleaved codeword 342 is accessed from central memory circuit 340 and globally interleaved by a global interleaver/deinterleaver circuit 344. Global interleaver/deinterleaver circuit 344 may be any circuit known in the art that is capable of globally rearranging codewords. Global interleaver/deinterleaver circuit 344 provides a decoder input 346 to data decoding circuit 350.

The data decoding circuit 350 includes a low density parity check decoder circuit 362 that applies a low density parity check decoding algorithm to the decoder input 346. The low density parity check decoder circuit 362 may be any circuit known in the art or that may be developed that is capable of applying a low density parity check decoding algorithm, including binary and non-binary decoders, layered and non-layered, regular and irregular, and applying any suitable parity check algorithm. The data decoding circuit 350 also includes low syndrome error handling components that help determine whether the user data has converged correctly in the low density parity check decoder circuit 362 when the decoding results in a low syndrome error. Where the data converges in the low density parity check decoder circuit 362, either with a syndrome of 0 or with the user data converging correctly as determined by the low syndrome error handling, decoded output 364 from data decoding circuit 350 is provided to a hard decision deinterleaver 366 that reverses the interleaving performed earlier in local interleaver circuit 336 and global interleaver/deinterleaver circuit 344, yielding deinterleaved decoded output 368. The deinterleaved decoded output 368 is decoded in modulation decoder 370, which reverses the modulation encoding applied by modulation encoder 304, yielding decoded data 372.

A cyclic redundancy check circuit 374 is used to check the decoded data 372 from the modulation decoder 370 when data has converged, that is, when the syndrome from low density parity check decoder circuit 362 is 0. The cyclic redundancy check is performed in any suitable manner, calculating cyclic redundancy check bits and comparing them with those inserted in the user data by cyclic redundancy check encoder 302. Based upon the disclosure provided herein, one of ordinary skill in the art will recognize a variety of cyclic redundancy check circuits that may be used in relation to different embodiments of the present invention. The output 376 of cyclic redundancy check circuit 374 comprises decoded data with cyclic redundancy check bits removed and is stored in hard decision memory 378 before being output as user data 380.

Where the data decoding algorithm as applied by low density parity check decoder circuit 362 and the low syndrome error handling failed to converge, soft decoder output 352 from data decoding circuit 350 is transferred back to central memory circuit 340 via global interleaver/deinterleaver circuit 344. Prior to storage of the soft decoder output 352 to central memory circuit 340, the soft decoder output 352 is globally deinterleaved to yield a globally deinterleaved output 354 that is stored to central memory circuit 340. The global deinterleaving reverses the global interleaving earlier applied to the interleaved codeword 342 to yield the decoder input 346. Once data detector circuit 332 is available, a previously stored deinterleaved output 356 is accessed from central memory circuit 340 and locally deinterleaved by a local deinterleaver circuit 358. Local deinterleaver circuit 358 rearranges the globally deinterleaved output 354 to reverse the shuffling originally performed by local interleaver circuit 336. A resulting deinterleaved output 360 is provided to data detector circuit 332 where it is used to guide subsequent detection of a corresponding data set received as equalized output from equalizer circuit 328.

The data decoding circuit 350 processes the decoder input 346 in low density parity check decoder circuit 362, performing a limited number of local decoding iterations in the low density parity check decoder circuit 362 and stopping early if the syndrome is 0, indicating that the user data and parity bits have converged. The test that triggers low syndrome error handling is performed in a low syndrome checker circuit 386, also referred to herein as a parity checker circuit, which receives the syndrome and parity bits 384 from low density parity check decoder circuit 362. The test is performed in some embodiments when the syndrome remains non-zero and is not reduced with successive local decoding iterations in the low density parity check decoder circuit 362. In other embodiments, the test to trigger low syndrome error handling is performed in the low syndrome checker circuit 386 after every local decoding iteration. Again, in some embodiments the low syndrome checker circuit 386 compares the syndrome resulting from decoding in the low density parity check decoder circuit 362 against a threshold, and if the syndrome is non-zero but less than the threshold, the low syndrome checker circuit 386 triggers a low syndrome error handling operation.

The cyclic redundancy check circuit 374 is also used in some embodiments of low syndrome error handling, triggered when the low syndrome checker circuit 386 identifies a low syndrome error condition. The cyclic redundancy check circuit 374 is used to perform the cyclic redundancy check on the decoded data 372 from the low density parity check decoder circuit 362 even though the syndrome from the low density parity check decoder circuit 362 is non-zero. If the result or syndrome from the cyclic redundancy check circuit 374 is 0, it is assumed that the decoded user data is correct and that the non-zero syndrome from the low density parity check decoder circuit 362 is due entirely to parity bit errors. Decoding is finished, and the output 376 of cyclic redundancy check circuit 374 is stored in hard decision memory 378 and output as user data 380. If, on the other hand, the cyclic redundancy check circuit 374 detects errors in the user data in the hard decision decoder output 364, the cyclic redundancy check circuit 374 generates an error signal 390, for example setting a fail flag register 392 indicating that decoding has failed for the data sector. Other recovery features can then be employed, such as targeted symbol flipping.

In some other embodiments, when low syndrome error handling is triggered by the low syndrome checker circuit 386, a parity correction circuit 382 attempts to determine if the user data is correct despite the low syndrome by trying to locate the parity bits that can generate a syndrome of 0. If the erroneous parity bits can be located that, when corrected, make the syndrome 0, the decoded user data is correct and the decoding process can be concluded. In some embodiments, the parity correction circuit 382 performs (or causes the low density parity check decoder circuit 362 to perform) low density parity check decoding based only on the parity portion of the H matrix, essentially forming a much smaller H matrix including only parity bits and decoding the parity H matrix to detect and correct parity bit errors. In other embodiments, the parity correction circuit 382 re-encodes the user data to produce computed parity bits that are compared with the decoded parity bits to identify discrepancies. The parity correction circuit 382 thus applies the same algorithm as the low density parity check decoder circuit 362 or the low density parity check encoder 306, or operates as a controller to cause the low density parity check decoder circuit 362 to do so, in order to locate erroneous parity bits. Based upon the disclosure provided herein, one of ordinary skill in the art will recognize a variety of low density parity check circuits that may be used to locate erroneous parity bits in relation to different embodiments of the present invention. If the erroneous parity bits are identified, they are corrected, causing the syndrome from low density parity check decoder circuit 362 to be 0, and the hard decision decoder output 364 is output from the data decoding circuit 350. If, on the other hand, the parity bits cannot be identified that result in a syndrome of 0, the fail flag register 392 is set, indicating that decoding has failed for the data sector. Other recovery features can then be employed, such as targeted symbol flipping.

Figure 4:
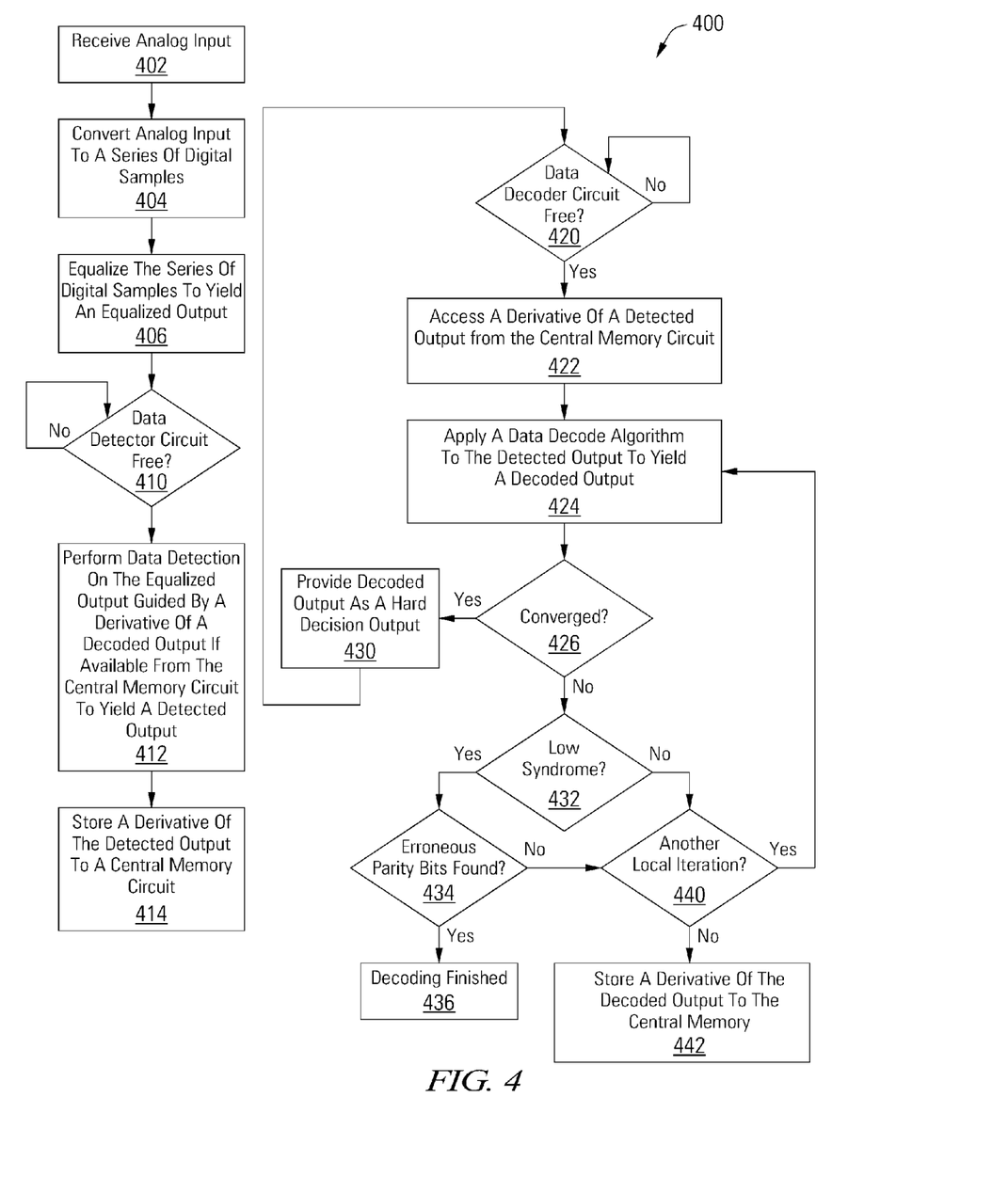
FIG. 4 depicts a flow diagram showing a method for syndrome errors with low Hamming weights during decoding of an irregular low density parity check code in accordance with various embodiments of the present invention.

Turning to FIG. 4, a flow diagram 400 depicts an operation for processing data, including handling low syndrome errors from a low density parity check decoder in accordance with some embodiments of the present invention. Following flow diagram 400, an analog input is received (block 402). The analog input may be derived from, for example, a storage medium or a data transmission channel. Based upon the disclosure provided herein, one of ordinary skill in the art will recognize a variety of sources of the analog input. The analog input is converted to a series of digital samples (block 404). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 406). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 410). Where a data detector circuit is available (block 410), a data detection algorithm is applied to the equalized output guided by a data set derived from a decoded output where available (e.g., the second and later iterations through the data detector circuit and the data decoder circuit) from a central memory circuit to yield a detected output (block 412). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 414).

In parallel to the previously discussed data detection processing, it is determined whether a data decoder circuit is available (block 420). Where the data decoder circuit is available (block 420), a previously stored derivative of a detected output is accessed from the central memory (block 422). A low density parity check decode algorithm is applied to the derivative of the detected output to yield a decoded output (block 424). It is determined whether the decoded output converged (block 426). Convergence occurs where all of the parity checks applied as part of applying the low density parity check decoding algorithm are satisfied, resulting in a syndrome of 0. Where the decoded output converged (block 426), the decoded output is provided as a hard decision output (block 430).

Where the decoded output failed to converge (block 426), it is determined whether the syndrome is less than a threshold (block 432). The threshold is set at a level for which the detected number of errors, based on the syndrome value, can all be in the parity bits. In some embodiments the threshold is user programmable. If the syndrome is not less than the threshold (block 432), it is determined whether another local iteration is to be performed (block 440). In some cases, this is determined by comparing the number of local iterations that have been completed to a defined threshold number. Where another local iteration is not called for or allowed (e.g., the number of local iterations equals a maximum number of local iterations)(block 440), the decoded output is stored to the central memory circuit where it awaits processing by the data detector circuit (i.e., another global iteration) (block 442). Otherwise, where it is determined that another local iteration is called for or allowed (e.g., the number of local iterations is not equal to a maximum number of local iterations) (block 440), the processes of blocks 424-442 are repeated for the same data set using the previous decoded output as a guide.

If the syndrome is less than the threshold (block 432), the low syndrome error handling is triggered to locate erroneous parity bits. In some embodiments, low density parity check decoding is performed only on the parity portion of the H matrix to detect and correct parity bit errors. In other embodiments, the decoded user data is re-encoded in a low density parity check encoding process to produce computed parity bits that are compared with the decoded parity bits to identify discrepancies. If the erroneous parity bits can be located (block 434), resulting in a syndrome of 0, then decoding is finished (block 436). If the erroneous parity bits cannot be located (block 434), a determination is made (block 440) about whether decoding can continue or whether decoding has failed and other recovery features will be needed.

In other embodiments, rather than attempt to locate erroneous parity bits (block 434), a cyclic redundancy check is performed on the decoded user data from block 424 when a low syndrome error is detected (block 432), and if the cyclic redundancy check passes, decoding is finished (block 436). The user data has at this point been decoded correctly, despite the non-zero syndrome.

Figure 5:
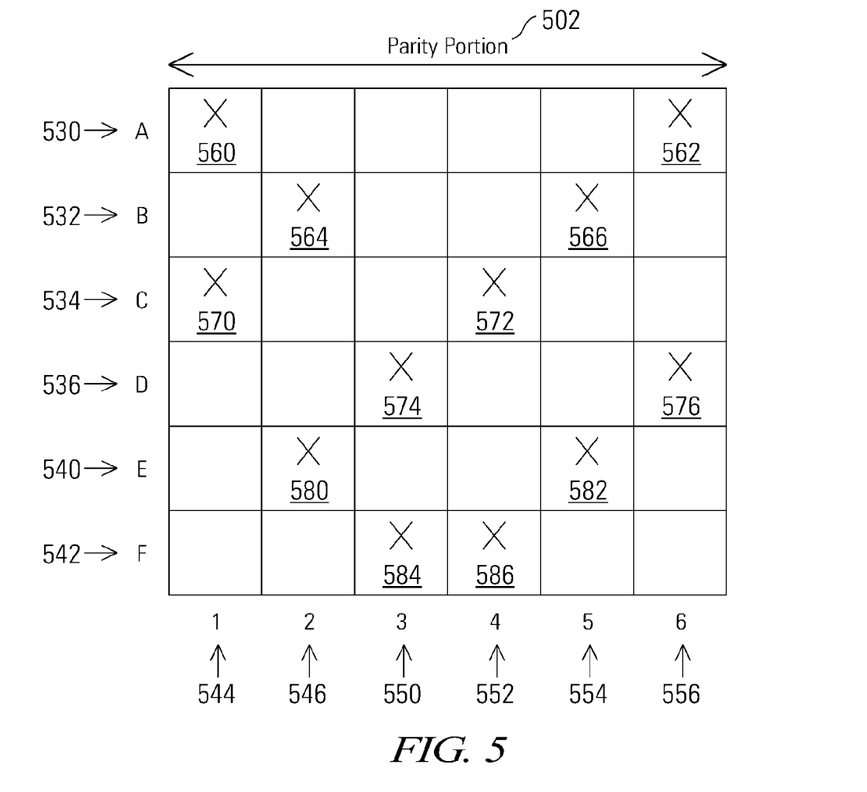
FIG. 5 depicts a parity portion of an H matrix in accordance with various embodiments of the present invention.

Turning to FIG. 5, some embodiments locate erroneous symbols in the parity portion 502 of the H matrix by tracing a path or loop made up of variable nodes and check nodes in the parity portion 502. In these embodiments, an (a,2) trapping set is identified in a weight-2 sparse matrix, an example embodiment of which is shown in FIG. 5, where a is a positive integer such as 1, 2, 3, etc. The term "trapping set" is used herein to refer not only to conventional trapping sets but also to convergence errors in a variable node/check node loop due to saturation. When the user symbols converge more quickly than the parity symbols because of the greater column weight in the user portion of the H matrix and because the user data is modulation encoded, the log likelihood ratio values for the parity symbols can quickly become saturated. The check node messages are then less able or unable to overcome and correct saturated erroneous parity symbol values.

The tracing procedure is initiated after a decoding operation results in a low syndrome error. A pair of check nodes with non-zero syndromes, in other words with failing parity checks, is identified in the sparse parity portion 502 of the H matrix. The paths between the two check nodes form a loop that can be traced in two different directions in an (a,2) pattern in a column weight 2 and row weight 2 sparse matrix 502. As the paths are traced, the expected value of each node is calculated based on the value of the starting check node. If, by the tracing operation, erroneous parity symbols can be identified that cause the low syndrome error, user symbols are ruled out as the cause of the low syndrome errors, and decoding can be successfully concluded with the correct user symbols despite the low syndrome error. In other words, if there is any non-zero check syndrome that cannot be fixed while tracing in the parity portion, the errors are not all located in the parity portion. In this case, the data sector has not been correctly decoded because there are errors in the decoded user data. Because there are two paths through the loop, there are two possible locations of parity-only errors that can be corrected to resolve the low syndrome error and establish that the user data was correctly decoded.

Figure 6:
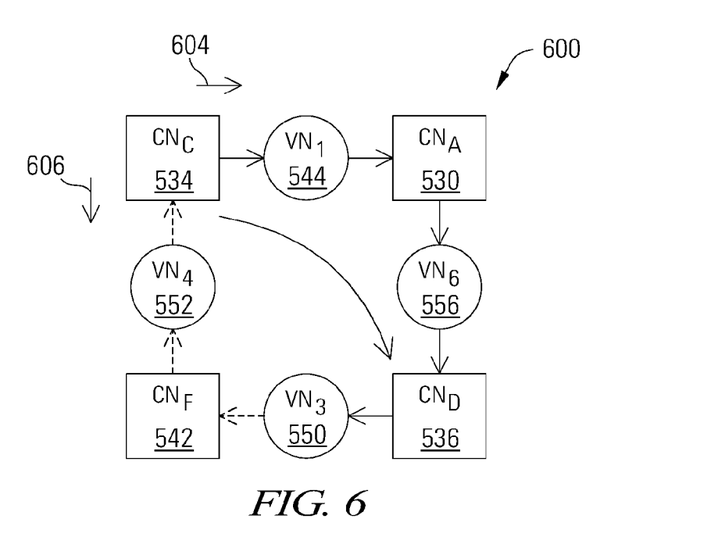
FIG. 6 depicts a path through a variable node and check node loop in the parity portion of the H matrix of FIG. 5 in accordance with various embodiments of the present invention.

In the sparse parity portion 502 of the H matrix in the embodiment of FIG. 5, check nodes $CN_A$ 530, $CN_B$ 532, $CN_C$ 534, $CN_D$ 536, $CN_E$ 540 and $CN_F$ 542 each have row weight 2 and are connected to two variable nodes in the parity portion 502. Variable nodes $VN_1$ 544, $VN_2$ 546, $VN_3$ 550, $VN_4$ 552, $VN_5$ 554 and $VN_6$ 556 each have column weight 2 and are connected to two check nodes in the parity portion 502. Connections between check nodes and variable nodes are indicated with an 'X' in FIG. 5. Each symbol is connected to two and only two check nodes, and each check node is connected to two and only two symbols in the parity portion 502. If check nodes $CN_C$ 534 and check node $CN_D$ 536 both produce non-zero syndromes, they form a loop 600 that can be traced in two directions 604 and 606 as in the (2,2) trapping set of FIG. 6. In the first direction 604 the path is $CN_C$ 534→$VN_1$ 544→$CN_A$ 530→$VN_6$ 556→$CN_D$ 536, along edges 570, 560, 562 and 576. In the second direction 606 the path is $CN_C$ 534→$VN_4$ 552→$CN_F$ 542→$VN_3$ 550→$CN_D$ 536, along edges 572, 586, 584 and 574.

The tracing may be performed by a low syndrome checker circuit (e.g., 384) and parity correction circuit (e.g., 390), identifying convergence errors in the path between the two check nodes $CN_C$ 534 and $CN_D$ 536, where at least one of the variable nodes in the path is stuck on an incorrect value due to a saturated log likelihood ratio value, and is therefore not being corrected by its connected check nodes. By tracing the paths from check node $CN_C$ 534, the value of check node $CN_D$ 536 is calculated as it should be if there were no stuck variable nodes between them. There may be any number of incorrect symbols between check nodes $CN_C$ 534 and $CN_D$ 536, depending on the length of the path between those two check nodes. Any check nodes between those two end check nodes may not report errors depending on the values of the connected symbols.

At each step along the path there is a unique symbol or check node that the connection leads to, coming from an incoming node and leading to a non-incoming node. For each check node to variable node connection, the variable node value that would satisfy the parity check is computed. For each variable node to check node connection, the check value is computed based on the variable node value. If the start and end check nodes $CN_C$ 534 and $CN_D$ 536 are in a loop, the connections from check node $CN_C$ 534 will eventually lead to check node $CN_D$ 536. If the tracing procedure identifies parity symbol errors that caused the low syndrome error, the user data was correctly decoded and the decoding can be successfully concluded with a report that the user data is correct.

If neither of the two paths through a loop contains errors that can be corrected to resolve the syndrome error, then the check violations are also caused by symbols in the user data outside of the loop structure in the parity portion 502 of the H matrix, and the decoding was not successful. Again, further error recovery operations can then be performed to identify and correct the user data symbol errors.

When there are more than two check errors in the parity portion 502 of the H matrix, tracing can be performed between each pair to determine whether there are multiple disjoint (a,2) trapping sets. For example, if check nodes $CN_B$ 532 and $CN_E$ 540 also yield non-zero syndromes, loops between each possible combination of the four check nodes $CN_B$ 532, $CN_C$ 534, $CN_D$ 536 and $CN_E$ 540 can be traced to identify erroneous parity symbols. One such loop between check nodes $CN_B$ 532 and $CN_E$ 540 includes paths $CN_B$ 532→$VN_2$ 546→$CN_E$ 540 along edges 564 and 580, and $CN_B$ 532→$VN_5$ 554→$CN_E$ 540 along edges 566 and 582.

In some embodiments, the variable node/check node loops are traced using an alternating table look up operation, exploiting the simple structure of the column weight 2 and row weight 2 sparse matrix 502 to efficiently find the (a,2) patterns and potentially correct the errors and flag the data sector as having been correctly decoded. In some embodiments the tracing procedure is applied in a quasi-cyclic low density parity check decoder when decoding results in low syndrome errors. In some of these embodiments, the H matrix has a quasi-cyclic structure in which each circulant is a 10×10 sub matrix that could have 96 symbols, where each sub matrix is a simple permutation matrix with row and column weight 1. Each of the 96 symbols within a circulant is uniquely described in the lookup table by its quasi-cyclic shift and, in a non-binary decoder, by its permutation, the non-zero Galois Field element from the H matrix for the circulant. The lookup table is populated at design time in some embodiments based on the design of the low density parity check code. During a tracing operation, the lookup table is used to determine what variable nodes are connected to a given check node and to calculate the value of the variable node such that a check node's syndrome can be satisfied. If a check node has value I, it can be determined that a connected variable node symbol value must be X, but if the check node has value J, then the connected variable node symbol value must be Y. There is a unique translation from a check node syndrome to variable node symbol value, assuming that the variable node symbol value caused that check node syndrome. In order to do this calculation, the quasi-cyclic shift is retrieved from the lookup table to determine the symbol index, identifying the symbol within the circulant, and the Galois Field element is retrieved from the lookup table to identify the permutation value. The symbol index and value are determined, the next check syndrome can be computed given this symbol value. From the computed check syndrome, the next variable node symbol value can be computed, and so on.

Figure 7:
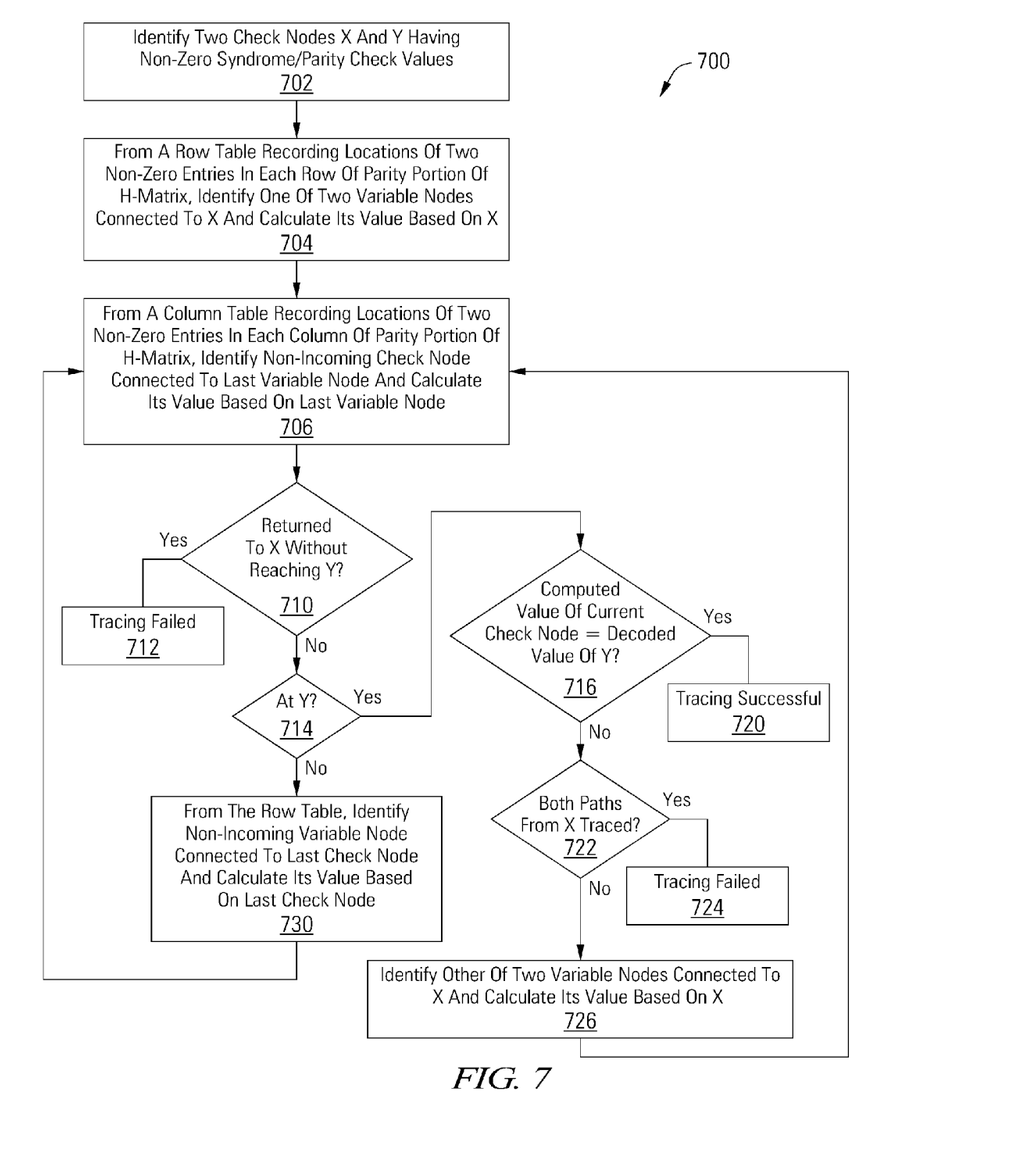
FIG. 7 depicts a flow diagram showing a method for locating erroneous symbols in the parity portion of an H matrix by tracing a variable node and check node loop in accordance with various embodiments of the present invention.

Turning to FIG. 7, a flow chart 700 depicts a method for locating erroneous symbols in the parity portion of an H matrix by tracing a variable node and check node loop in accordance with various embodiments of the present invention. The method can be triggered after a decoding operation that results in a low syndrome error. Two check nodes X and Y having non-zero syndromes or parity check values are identified. (Block 702) Check nodes X and Y are located in a sparse parity portion of an H matrix with column and row weights of 2. From a row table recording locations of two non-zero entries in each row of the parity portion of the H-matrix, one of two variable nodes connected to X is identified and its value is calculated based on X. (Block 704) The selection of one of the two variable nodes connected to X establishes the direction or path taken through the loop for the first part of the tracing operation. From a column table recording locations of two non-zero entries in each column of the parity portion of the H-matrix, the non-incoming check node connected to the last variable node is identified and its value is calculated based on the last variable node. (Block 706) A determination is made as to whether the tracing has returned to X without reaching Y. (Block 710) If so, tracing has failed. If not, a determination is made as to whether the tracing has reached Y. If so, a determination is made as to whether the computed value of the current check node Y is equal to the decoded value of check node Y. (Block 716) The computed value of the current check node Y is based on corrected symbol values in the traced path. If so, the tracing operation is successful. (Block 720) In other words, if the tracing operation is able to identify and correct symbol errors between X and Y that can resolve the low syndrome error, the tracing operation is successful. If the computed value of the current check node Y is not equal to the decoded value of check node Y (Block 716), a determination is made as to whether both paths from X have been traced. (Block 722) If so, tracing has failed. (Block 724) Otherwise, the other of the two variable nodes connected to X is identified and its value is calculated based on X. (Block 726) The tracing operation continues with Block 706. If at Block 716 the current check node is not check node Y, the non-incoming variable node connected to the last check node is identified and its value is calculated based on the last check node. (Block 730) The tracing operation continues with Block 706. The tracing operation thus traces one or both paths from X to Y, correcting symbol errors as they are identified, and determining whether the corrections resolve the low syndrome error.

Figure 8:
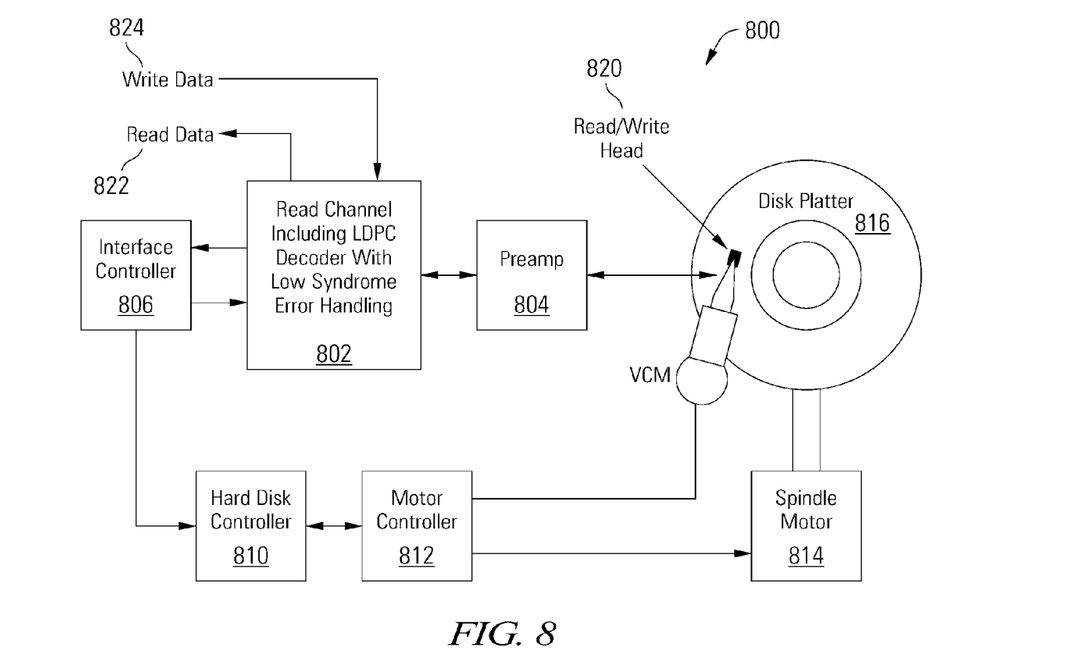
FIG. 8 depicts a storage system including a low density parity check decoder with low syndrome error handling in accordance with some embodiments of the present invention.

Turning to FIG. 8, a storage system 800 is illustrated as an example application of a low density parity check decoder with low syndrome error handling in accordance with some embodiments of the present invention. The storage system 800 includes a read channel circuit 802 with a low density parity check decoder with low syndrome error handling in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816.

The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of processing the received information, read channel circuit 802 performs a data decoding process on the received signal using a low density parity check decoder with low syndrome error handling. Such a low density parity check decoder with low syndrome error handling may be implemented consistent with the disclosure above in relation to FIGS. 1-3 and 5-6. In some cases, the data decoding with low syndrome error handling may be performed consistent with the flow diagrams disclosed above in relation to FIGS. 4 and 7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 9:
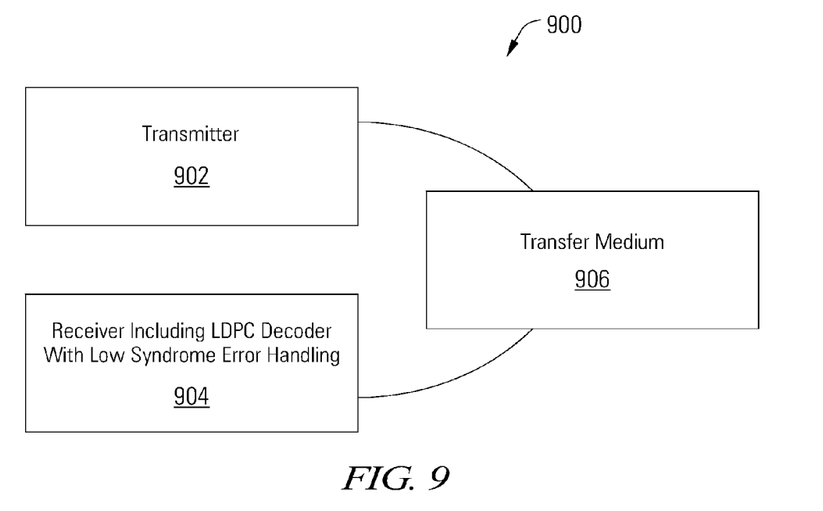
FIG. 9 depicts a wireless communication system including a low density parity check decoder with low syndrome error handling in accordance with some embodiments of the present invention.

Turning to FIG. 9, a wireless communication system 900 or data transmission device including a transmitter 902 and receiver 904 with a low density parity check decoder with low syndrome error handling is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a low density parity check decoder with low syndrome error handling. Such a low density parity check decoder with low syndrome error handling may be implemented consistent with the disclosure above in relation to FIGS. 1-3 and 5-6. In some cases, the data decoding with low syndrome error handling may be performed consistent with the flow diagrams disclosed above in relation to FIGS. 4 and 7.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for low density parity check decoding with low syndrome error handling. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
 a data decoder circuit operable to apply a data decode algorithm to a decoder input to yield a decoded output and to calculate a syndrome indicating an error level for the decoded output;
 an error handling circuit operable to determine whether any errors in the decoded output involve user data symbols; and
 a syndrome checker circuit operable to trigger the error handling circuit based at least in part on the syndrome, wherein the syndrome checker circuit is operable to compare the syndrome with a threshold and to trigger the error handling circuit when the syndrome is greater than zero and less than the threshold.

2. The data processing system of claim 1, wherein the threshold is set at a level low enough that all errors in the decoded output could be parity symbol errors.

3. The data processing system of claim 1, wherein the data decoder circuit comprises a low density parity check decoder for an irregular low density parity check code.

4. The data processing system of claim 1, wherein the error handling circuit comprises a cyclic redundancy check circuit operable to perform a cyclic redundancy check on user data symbols in the decoded output, and if the cyclic redundancy check passes, to indicate that decoding in the data decoder circuit is successful despite the syndrome indicating a non-zero error level.

5. The data processing system of claim 1, wherein the error handling circuit is operable to locate erroneous parity symbols in the decoded output that, when corrected, cause the syndrome to indicate that no errors exist in the decoded output.

6. The data processing system of claim 5, wherein the error handling circuit is operable to locate the erroneous parity symbols by applying a low density parity check algorithm to only a parity portion of a parity check H matrix.

7. The data processing system of claim 5, wherein the error handling circuit is operable to locate the erroneous parity symbols by re-encoding user data symbols in the decoded output to yield calculated parity symbols, and to compare the calculated parity symbols with decoded parity symbols in the decoded output.

8. The data processing system of claim 5, wherein the error handling circuit is operable to locate the erroneous parity symbols by tracing a path between a pair of check nodes with parity check errors.

9. The data processing system of claim 8, wherein the pair of check nodes with parity check errors are in a column weight two and row weight two portion of a parity check matrix.

10. The data processing system of claim 8, wherein the error handling circuit is further operable to correct the erroneous parity symbols and to determine whether the correction resolves the error level indicated by the syndrome.

11. The data processing system of claim 1, wherein the data processing system is implemented as part of a device selected from a group consisting of a storage device and a receiving device.

12. The data processing system of claim 1, wherein the data processing system is implemented as an integrated circuit.

13. A method of decoding data, comprising:
applying a decoding algorithm to the data in a low density parity check decoder to yield a decoded output and a syndrome indicating an error level for the decoded output;
comparing the syndrome with a threshold;
when the syndrome indicates a non-zero error level lower than the threshold, determining whether any user data in the decoded output is erroneous; and
indicating that the decoded output is correct when no user data is determined to be erroneous, even when the syndrome indicates a non-zero error level.

14. The method of claim 13, wherein the syndrome is compared with the threshold when the syndrome stops decreasing with successive decoding iterations in the low density parity check decoder.

15. The method of claim 13, wherein the threshold is set at a level low enough that all errors in the decoded output could be parity symbol errors.

16. The method of claim 13, wherein determining whether any user data in the decoded output is erroneous comprises performing a cyclic redundancy check on the user data in the decoded output.

17. The method of claim 13, wherein determining whether any user data in the decoded output is erroneous comprises searching for erroneous parity symbols in the decoded output that, when corrected, cause the syndrome to indicate that no errors exist in the decoded output.

18. The method of claim 17, wherein searching for erroneous parity symbols in the decoded output comprises applying a low density parity check algorithm to only a parity portion of a parity check H matrix.

19. The method of claim 17, wherein searching for erroneous parity symbols in the decoded output comprises re-encoding user data symbols in the decoded output to yield calculated parity symbols, and comparing the calculated parity symbols with decoded parity symbols in the decoded output.

20. The method of claim 17, wherein searching for erroneous parity symbols in the decoded output comprises tracing a path between a pair of check nodes with parity check errors in a column weight two and row weight two portion of a parity check matrix.

21. A storage system comprising:
a storage medium;
a head assembly disposed in relation to the storage medium and operable to provide a sensed signal corresponding to information on the storage medium;
an analog to digital converter circuit operable to sample an analog signal derived from the sensed signal to yield a series of digital samples; and
a data processing system operable to identify correct values for the digital samples, comprising:
a data decoder circuit operable to apply a data decode algorithm to a decoder input derived from the digital samples to yield a decoded output and to calculate a syndrome indicating an error level for the decoded output;
an error handling circuit operable to determine whether any errors in the decoded output involve user data symbols;
a syndrome checker circuit operable to trigger the error handling circuit based at least in part on the syndrome; and
a cyclic redundancy check circuit operable to test the user data symbols in the decoded output, wherein when the cyclic redundancy check circuit finds no errors in the user data symbols, decoding is completed successfully even if the syndrome indicates a non-zero error level.

22. The storage system of claim 21, wherein the error handling circuit is operable to locate erroneous parity symbols in the decoded output that, when corrected, cause the syndrome to indicate that no errors exist in the decoded output.

23. The storage system of claim 22, wherein the error handling circuit is operable to locate the erroneous parity symbols by re-encoding user data symbols in the decoded output to yield calculated parity symbols, and to compare the calculated parity symbols with decoded parity symbols in the decoded output.

24. The storage system of claim 21, wherein the syndrome checker circuit is operable to compare the syndrome with a threshold and to trigger the error handling circuit when the syndrome is greater than zero and less than the threshold.

* * * * *